(12) United States Patent
Popa

(10) Patent No.: US 10,728,420 B2
(45) Date of Patent: Jul. 28, 2020

(54) LOSSY COMPRESSION FOR IMAGES AND SIGNALS BY IDENTIFYING REGIONS WITH LOW DENSITY OF FEATURES

(71) Applicant: Wind River Systems, Inc., Alameda, CA (US)

(72) Inventor: Ionut Popa, Galati (RO)

(73) Assignee: Wind River Systems, Inc., Alameda, CA (US)

( * ) Notice: Subject to any disclaimer, the term of this patent is extended or adjusted under 35 U.S.C. 154(b) by 142 days.

(21) Appl. No.: 15/950,919

(22) Filed: Apr. 11, 2018

(65) Prior Publication Data

US 2019/0320090 A1  Oct. 17, 2019

(51) Int. Cl.
*G06K 9/00* (2006.01)
*H04N 1/41* (2006.01)
*H04N 19/13* (2014.01)
*H04N 19/80* (2014.01)
*H03M 7/30* (2006.01)

(52) U.S. Cl.
CPC .............. *H04N 1/41* (2013.01); *H04N 19/13* (2014.11); *H04N 19/80* (2014.11); *H03M 7/3059* (2013.01)

(58) Field of Classification Search
CPC .......... H04N 1/41; H04N 19/80; H04N 19/13; H03M 7/3059

USPC .................................................. 382/232-253
See application file for complete search history.

(56) References Cited

U.S. PATENT DOCUMENTS

| | | | |
|---|---|---|---|
| 2013/0071041 A1* | 3/2013 | Jin ........................ | G06T 3/4053 382/254 |
| 2014/0212013 A1* | 7/2014 | Han ...................... | G06T 11/008 382/131 |
| 2018/0101932 A1* | 4/2018 | Kwon ................... | G06T 3/0068 |
| 2019/0191210 A1* | 6/2019 | Xiao .................. | H04N 21/4333 |

* cited by examiner

*Primary Examiner* — Andrew M Moyer
(74) *Attorney, Agent, or Firm* — Fay Kaplun & Marcin, LLP

(57) ABSTRACT

A device, system, and method perform lossy compression for images and signals by identifying regions with a low density of features. The method performed at a sensor communicatively connected to a receiver includes capturing sensor data. The method includes selecting a position in the sensor data. The method includes determining a local entropy of the position based on an entropy operation that indicates a probability distribution of a plurality of available values. When the local entropy is below a predetermined threshold, the method includes applying a first pre-processing operation to the position that averages features included in the position. The method includes transmitting the pre-processed sensor data corresponding to the position to the receiver.

18 Claims, 7 Drawing Sheets

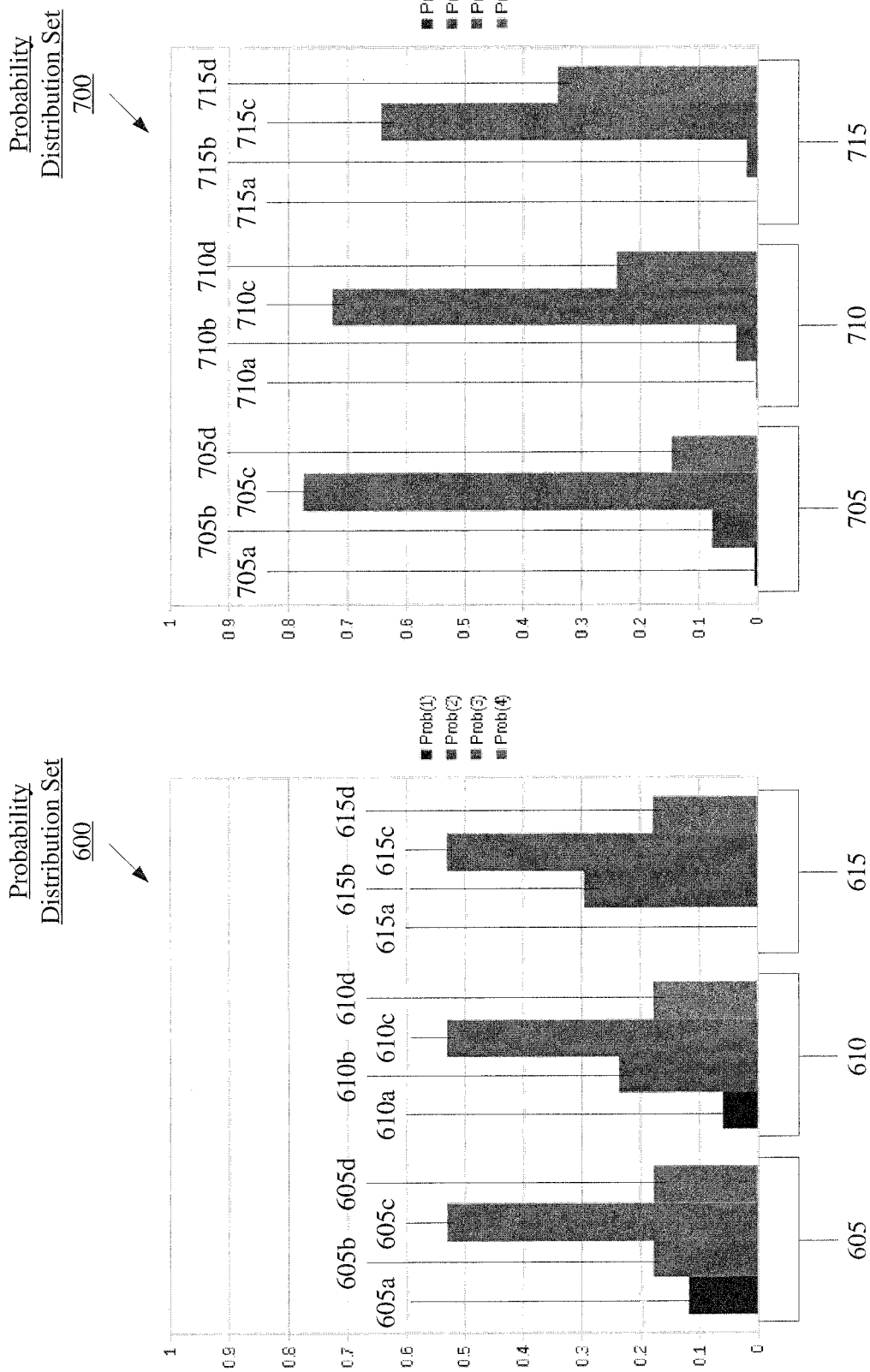

LOSSY COMPRESSION FOR IMAGES AND SIGNALS BY IDENTIFYING REGIONS WITH LOW DENSITY OF FEATURES

BACKGROUND INFORMATION

An image may be captured using a variety of different capturing devices using various parameters. With improvements to image capturing devices and a corresponding quality at which images may be captured, an increased amount of data may be required to be associated with creating this high quality image. For example, a size of the image that is stored may increase with a greater density of pixels for the quality to be shown. In one manner, a resulting image file that is created may require further amounts of data. In another manner, when the image capturing device includes a sensor and receiver configuration where the sensor captures data of the image and this data is provided to the receiver for processing, the bandwidth required for this data to be transmitted between the components of the image capturing device increases. Thus, in exchange for greater quality in a captured image, storage requirements and transmission/bandwidth requirements increase which may negatively impact a user experience.

SUMMARY

The exemplary embodiments are directed to a method for lossy compression performed at a sensor communicatively connected to a receiver. The method includes capturing sensor data and selecting a position in the sensor data. The method includes determining a local entropy of the position based on an entropy operation that indicates a probability distribution of a plurality of available values. When the local entropy is below a predetermined threshold, the method includes applying a first pre-processing operation to the position that averages features included in the position. The method includes transmitting the pre-processed sensor data corresponding to the position to the receiver.

The exemplary embodiments are directed to a sensor performing a lossy compression. The sensor includes a capturing component configured to capture sensor data. The sensor includes a processor selecting a position in the sensor data. The processor determines a local entropy of the position based on an entropy operation that indicates a probability distribution of a plurality of available values. When the local entropy is below a predetermined threshold, the processor applies a first pre-processing operation to the position that averages features included in the position. The sensor includes a transceiver configured to transmit the pre-processed sensor data corresponding to the position to a receiver that is communicatively connected to the sensor.

The exemplary embodiments are directed to an imaging arrangement performing a lossy compression. The imaging arrangement includes a receiver and a sensor. The sensor captures image data and selects a position in the image data. The sensor determines a local entropy of the position based on an entropy operation that indicates a probability distribution of a plurality of available values. When the local entropy is below a predetermined threshold, the sensor applies a first pre-processing operation to the position that averages features included in the position. When the local entropy is at least the predetermined threshold, the sensor applies a second pre-processing operation to the position that retains the features included in the position. The sensor transmits the pre-processed sensor data corresponding to the position to the receiver. The receiver performs a compression operation on the pre-processed sensor data corresponding to the position.

BRIEF DESCRIPTION OF THE DRAWINGS

FIGS. 6 and 7 show example probability distribution sets of the displacements of FIGS. 3-5 according to various exemplary embodiments described herein.

DETAILED DESCRIPTION

Figure 1:
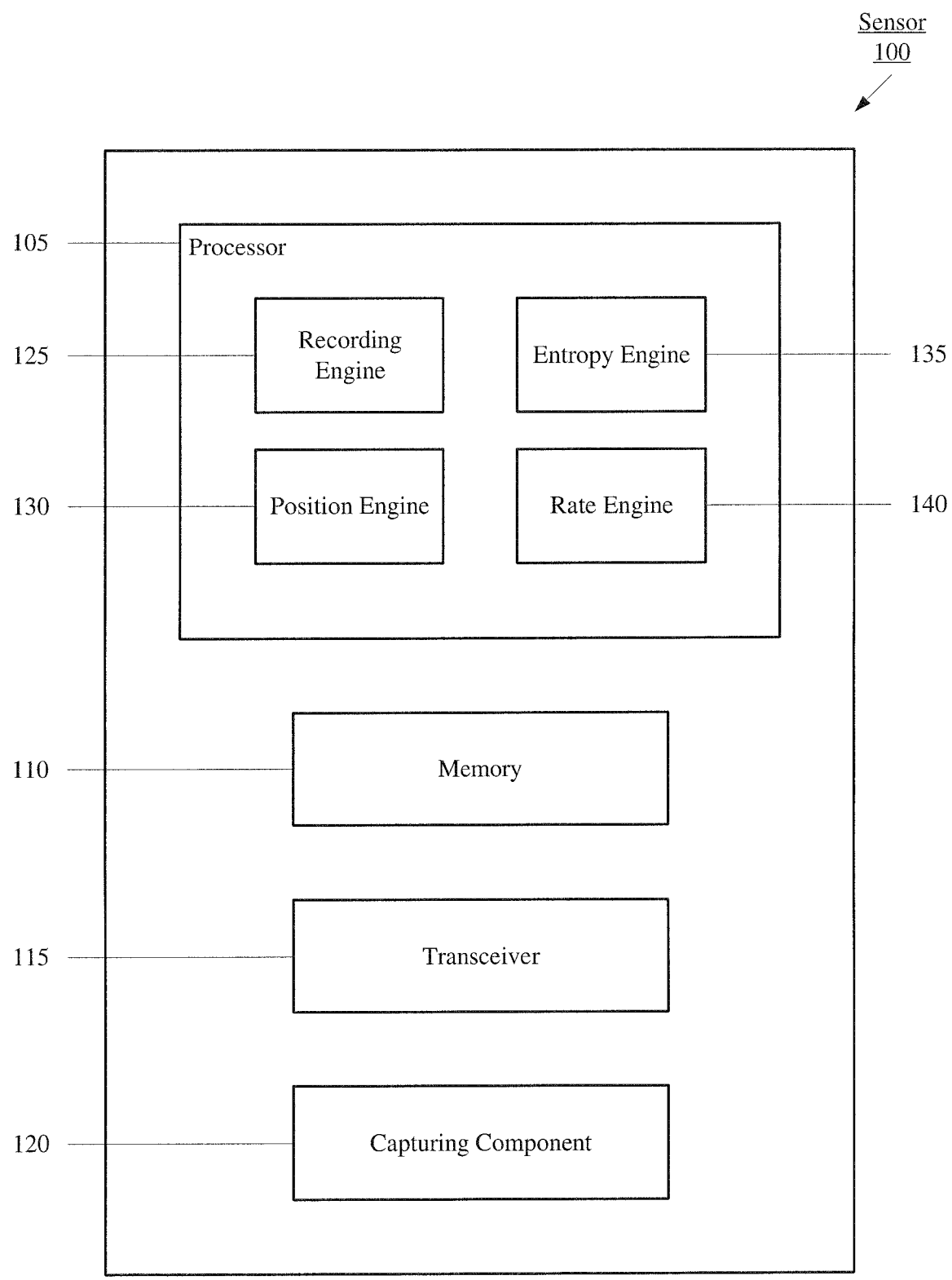
FIG. 1 shows an example sensor capturing data according to various exemplary embodiments described herein.

The exemplary embodiments may be further understood with reference to the following description and the related appended drawings, wherein like elements are provided with the same reference numerals. The exemplary embodiments are related to a device, a system, and a method for performing an entropy based processing on an image to determine whether regions in the image have a high density of features or a low density of features. The exemplary embodiments provide a mechanism to process the regions with a low density of features using an averaging operation that, from the perspective of a viewer, substantially maintains a quality similar to the regions of a high density of features that are processed using standard operations. Using the standard and averaging operations respectively to regions of high density and low density, the image quality is substantially maintained, the data requirements (e.g., storage, bandwidth, etc.) are reduced, and the user experience is improved.

Initially, it is noted that the exemplary embodiments are described herein with regard to capturing an image and image processing. However, the use of an image and image related operations is only exemplary. The exemplary embodiments may be utilized for any data captured by a sensor including a capturing component. For example, the exemplary embodiments may be modified to be used in capturing and processing audio data. The audio data may also be processed using the entropy based approach to determine regions in the audio having high or low density of features.

As those skilled in the art will understand, there are various ways of processing image data that is being captured by a sensor. In one particular manner, the sensor may be configured to capture the image data which is provided to a receiver. The receiver may forward the image data to a processing unit or itself perform processing operations on the image data. The timing of performing the image processing is conventionally executed after the sensor has captured the image data and has provided the image data to the receiver or processing unit (hereinafter collectively referred to as "receiver"). When the image capturing device includes the sensor and the receiver, the sensor may capture the image data at a predefined setting and generate corresponding data which is relayed to the receiver. Often, this setting corresponds to a highest image quality which results in the greatest amount of data. Reducing the quality for user preference selections or other considerations may be performed during the processing stage at the receiver. Thus, a bandwidth (e.g., when the sensor/receiver configuration utilizes a network configuration or a short-range device to device connection such as Bluetooth) is used for this transmission. When image processing operations are performed by the receiver, the data is first transmitted. Thus, with a higher quality for the resulting image file, the amount of data may require a higher bandwidth or additional time to process the image data.

The image processing operations that may be used by conventional image capturing devices may include, for example, a bilateral-filtering method or an anisoptropic diffusion method. The bilateral-filtering method may relate to smoothly filtering image data by non-linearly preserving edges and reducing noise. The bilateral-filtering method may replace an intensity of a pixel in the image with a weighted average (e.g., based on a Gaussian distribution) of intensities from adjacent or neighboring pixels (e.g., based on a Euclidean distance and/or radiometric differences). The anisotropic diffusion method may relate to reducing noise in an image with only minimal removal of relatively significant portions of the image content (e.g., lines, edges, etc.). By performing a diffusion process where successive images that are generated are further blurred, a convolution between images and a two-dimensional isotropic Gaussian filter may be determined in a linear and space-invariant transformation manner. Using the diffusion process, the anisotropic diffusion method may then combine the original image with a filter based on local content in a non-linear and space-variant transformation manner.

However, the bilateral-filtering method and the anisotropic diffusion method utilize gradient analysis to identify candidate areas for denoising. As those skilled in the art will understand, gradient analysis entails analyzing a directional change in intensity, color, shade, etc. in an image. For example, a gradient analysis may result in a gradient having a particular linear direction, a circular direction, an inward direction, an outward direction, a random direction, a combination thereof, etc. The gradient analysis may be used to identify lines, edges, color blends, etc. However, those skilled in the art will understand that gradient analysis may require certain assumptions to perform select evaluations. For example, an intensity function may only be known at discrete points or pixels in the image. Thus, derivatives of this intensity function may remain undefined unless an underlying continuous intensity function is assumed. Using further assumptions, the derivative of the continuous intensity function may be computed as a function on the sampled intensity function such as the image itself.

Using the gradient analysis through the bilateral-filtering method or the anisotropic diffusion method, the image may be processed to ultimately create an image file. The image file may be compressed in its entirety to reduce an overall data requirement of the image file, potentially at the cost of the quality of the image as a whole. The image processing operations may also reduce noise using noise reduction operations. However, using the above image processing methods and gradient analysis, local changes in the image or in signal properties may be missed due to the relatively less sensitive nature of these operations.

The exemplary embodiments provide a mechanism that evaluates a local presence of features in a given locus or window of a signal by analyzing a local probability distribution based on entropy or a measure of the data content in the locus where a low entropy corresponds to a relatively low density of features and a high entropy corresponds to a relatively high density of features. Those skilled in the art will appreciate that a processing method based on local entropy distribution as used in the exemplary embodiments may be more sensitive to subtle local changes in the image or in signal properties. The mechanism according to the exemplary embodiments are configured to pre-process captured image data such that regions with a low density of features have an averaging or denoising operation applied thereto while regions with a high density of features are kept intact by applying a standard processing operation. Thus, in a first manner, a sensor capturing the image data that performs this functionality may generate corresponding data for the regions with a low density of features that has lower data requirements and therefore lower bandwidth/transmission requirements. In a second manner, the image may include more compressible data since noise in these regions may already be removed.

FIG. 1 shows a sensor 100 capturing data according to various exemplary embodiments described herein. The sensor 100 may be part of an image processing arrangement in which data captured by the sensor 100 is transmitted to the receiver (not shown). The sensor 100 may represent any combination of hardware, software, and/or firmware used to capture image data. For example, the sensor 100 may be the capturing device of a still image camera, a video camera, etc. The sensor 100 may be implemented as a network component (e.g., an end device) or part of a short-range device to device connection. The sensor 100 may include a processor 105, a memory 110, a transceiver 115, and a capturing component 120. The sensor 100 may further include one or more of the following: a display device, an input/output (I/O) device, and other suitable components, such as, for example, a portable power supply, an audio I/O device, a data acquisition device, ports to electrically connect the sensor 100 to other electronic devices, etc.

The sensor 100 may be part of an image processing arrangement in which the sensor 100 is communicatively connected to a receiver. The receiver may include conventional components and provide conventional functionalities such as post-processing operations performed on image data received from the sensor 100. The image processing arrangement in which the sensor 100 is a part may include a plurality of components. In a first example, the image processing arrangement may include a communications network by which data is transmitted from the sensor 100 to the receiver. The communications network may represent any network by which the sensor 100 transmits data to the receiver. For example, the communications network may be a wireless network in which the sensor 100 connects using a wireless connection, a wired network in which the sensor 100 connects using a wired connection, a combination thereof, etc. The communications network may also represent any type of network such as a cellular network (e.g., 3G, 4G, LTE, etc.), a WiFi network, a HotSpot, a local area network (LAN), a wide area network (WAN), etc. Through the communications network, the sensor 100 may be located in any position where the connection to the communications network may be established. That is, there is no position requirement that the sensor 100 be co-located with the receiver. In a second example, the image processing arrangement may include components (as described below) configured to establish a short-range device to device connection (e.g., such as a Bluetooth connection) so that a data transmission may be performed from the sensor 100 to the receiver. In contrast to the communications network, the short-range device to device connection may require a position requirement where the sensor 100 is substantially co-located with the receiver. In a third example, the image processing arrangement may be embodied in a single device with internal communications.

The processor 105 may be configured to execute computer-executable instructions for operations from a plurality of engines that provide various functionalities of the sensor 100. For example, the plurality of engines may include programs including those used in the above identified operations, particularly with regard to the image processing mechanism. In another example, the engines of the sensor 100 may provide the features according to the exemplary embodiments in which regions having high and low density of features are identified and processed for transmission. In providing these features, the sensor 100 may include a recording engine 125, a position engine 130, an entropy engine 135, and a rate engine 140. The recording engine 125 may be configured to initially process the captured image data from the capturing component 120. The position engine 130 may be configured to identify a relative position of an image being processed. The entropy engine 135 may be configured to identify whether the position of the image has a high or low density of features. The rate engine 140 may be configured to utilize a pre-processing operation on the position of the image prior to transmission to the receiver based on the identification of the entropy engine 135.

It should be noted that the above noted engines each being an engine (e.g., a program) executed by the processor 105 is only exemplary. The functionality associated with the engines may also be represented as a separate incorporated component of the sensor 100 or may be a modular component coupled to the sensor 100, e.g., an integrated circuit with or without firmware. For example, the integrated circuit may include input circuitry to receive signals and processing circuitry to process the signals and other data. In addition, the functionality described for the processor 105 may be split among two or more processors. The exemplary embodiments may be implemented in any of these or other configurations of a gateway.

The memory 110 may be a hardware component configured to store data related to the functionalities performed by the sensor 100. For example, the memory 110 may store image data associated with signals from the capturing component 120 corresponding to portions of an image that is to be processed by the engines 125-140. The transceiver 115 may provide conventional functionalities in establishing a connection to the receiver. For example, as described above, the transceiver 115 may enable a connection or a communication to be established with the receiver using a network connection or a short-range connection. The capturing component 140 may be configured with various sub-components that capture raw image data. For example, the capturing component 120 may include automatically or manually set sub-components such as a lens, a filter, an aperture, a shutter release, etc.

The exemplary embodiments provide an image processing mechanism where image data captured by the sensor 100 is pre-processed prior to transmitting to a receiver for further processing of the image data. The image processing mechanism performed by the sensor 100 comprises an evaluation of a local presence of features in a given locus or window of a signal from the capturing component 120 by analyzing a local probability distribution or entropy where a low entropy identifies a low density of features and a high entropy identifies a high density of features. The image processing mechanism further comprises performing a corresponding pre-processing operation on the locus based on the identification. For regions with a low density of features, the pre-processing operation may include an averaging or denoising operation while for regions with a high density of features, the pre-processing operation may include a standard operation where a quality of the features in the locus are kept intact.

By utilizing the image processing mechanism including the pre-processing operation, the image data that is pre-processed prior to providing to the receiver may be more compressible by traditional compression algorithms and utilizes less data transmission requirements such as bandwidth for a connection between the sensor 100 and the receiver. In performing the pre-processing operations and utilizing the entropy based approach, a set of criteria may define the function identifying the local presence of features. In a first example, the function is to be continuous relative to position (e.g., a small displacement of position where the function is calculated should produce a small variance of a presence function). In a second example, the presence of a feature should increase the presence probability of other similar features.

The recording engine 125 may initially process the captured image data from the capturing component 120. For example, the capturing component 120 may capture raw image data. The raw image data may be formatted or otherwise initially processed to generate image data that is to be used by the further engines 130-140.

The position engine 130 may identify a relative position of an image being processed. As the capturing component 120 provides signals of the image data corresponding to a position in the captured image, the position engine 130 may track a relative position to be processed by the entropy engine 135 and the rate engine 140. In tracking the relative position, the image may be assembled based on the positions of the locus or window. The position also provides a section that is to be processed at a given time.

The entropy engine 135 may identify whether the position of the image has a high or low density of features. As will be described in further detail below, the entropy engine 135 may analyze the locus or window of image data for a relative position and determine whether there is a high density of features or a low density of features. The entropy engine 135 may determine a high density versus a low density based on an entropy value of the relative position and a predetermined threshold. Thus, if the position has an entropy value at least the predetermined threshold, the entropy engine 135 may determine that there is a high density of features while if the position has an entropy value less than the predetermined threshold, the entropy engine 135 may determine that there is a low density of features. According to an exemplary embodiment, the predetermined threshold may be based on possible values and a maximum theoretical entropy that may be achieved. For example, for a given signal (e.g., range of possible values), the maximum theoretical entropy may be calculated by considering all the possible values being equally distributed. In a first implementation, the predetermined threshold may be set to be half of the maximum theoretical entropy value. In a second implementation, the predetermined threshold may be tailored based on needs of a user who is using the features of the exemplary embodiments. Accordingly, the predetermined threshold may be set to a percentage of the maximum theoretical entropy value.

In a third implementation, the local entropy values may be calculated for a given signal or image and then normalized to a range inclusive of an interval from 0 to 1 where half the normalized value is set as the predetermined threshold.

The rate engine 140 may utilize a pre-processing operation on the position of the image prior to transmission to the receiver based on the identification of the entropy engine 135. As described above, the output of the entropy engine 135 may indicate whether a position in the image has a high density of features or a low density of features. Based on this indication, the rate engine 140 may apply an averaging or denoising operation on the position when the low density of features is indicated or apply a standard operation on the position when the high density of features is indicated. The rate engine 140 may apply the proper operation to each position of the image until the entire image has been pre-processed in this manner. Thereafter, the sensor 100 may transmit the image data for the entire image that has been pre-processed to the receiver in a piecemeal manner (e.g., whenever a position has been pre-processed) or in its entirety (e.g., after all positions have been pre-processed).

The image processing mechanism according to the exemplary embodiments may resemble bilateral filtering methods or anisotropic diffusion methods to one skilled in the art. However, in contrast to these approaches, the image processing mechanism according to the exemplary embodiments use local entropy instead of a gradients analysis to identify the candidate areas for denoising or averaging while other candidate areas are kept intact with a standard operation. Furthermore, the image processing mechanism according to the exemplary embodiments suggest an application to data compression (including still images or motion pictures) by removing the noise in some areas, hence resulting in more compressible data and lower transmission requirements from the sensor 100 to the receiver.

An approach that may be used by the entropy engine 135 to evaluate the local presence of features for a given position is Shannon Entropy which is defined as: $H(X)=-\Sigma p(x_i)\log(p(x_i))$, where X is a random variable with possibilities of $\{x_i, \ldots, x_n\}$ with a probability distribution of $p(x_i)$ for each $i=1 \ldots n$. The local entropy for a locus corresponding to the given position may be calculated by the entropy engine 135 by estimating the distribution probability for the given position of the input signal from the capturing component 120 and the recording engine 125. The distribution probability may be estimated using the individual frequency or counting the occurrences of each individual possible event $x_i$ inside the given position.

In determining the local entropy of the given position, the entropy engine 135 may perform a plurality of calculations. For a given random variable X with possibilities of $\{x_1, \ldots x_n\}$, the entropy may be defined as $$H(X) = -\sum x_i \log() \frac{p}{p(x_i)}$$

For a given finite sequence of $S=s_1 \ldots s_m$, where $s_j \in X$ for any $j=1 \ldots m$, the entropy may be estimated by considering a statistical frequency or occurrence of any symbol from X in S. Accordingly the occurrence function may be defined as $$O(x_i, j) = \begin{cases} 1, & \text{if } s_j = x_i \\ 0, & \text{otherwise} \end{cases}$$

for any $x_i \in X$ and $j=1 \ldots m$. This function has a value of 1, if and only if $x_i$ is found at position j in S. Therefore, the frequency function may be defined as $F(x_i)=\Sigma_{j=1}^{m}O(x_i,j)$, for any $x_i \in X$. The estimated probability for $x_i$ may be defined as $$p'(x_i) = \frac{F(x_i)}{\sum_{j=1}^{n} F(x_j)}$$

so that the local entropy may be calculated by defining the occurrence function only on a portion of the sequence S. A window function W for S of radius r and center l may be defined as any function that satisfies $W(j)>0$ for any $l-r\leq j\leq l+r$ and $W(j)=0$ for any other value. The window function may be symmetric relative to $l:W(l-j)=W(l+j)$. Thus, estimating the frequency using the product of O·W allows the entropy engine 135 to obtain the local entropy.

As noted above, there may be two criteria associated with identifying a local presence of features in the given position. To satisfy the continuity criteria, the frequency may be calculated based on a relative position of each individual value in a given locus corresponding to the position where each individual occurrence of a symbol is weighted with a continuous, symmetric function with the maximum in the center of the locus and 0 on the extremities.

The following describes an exemplary manner in which the entropy engine 135 identifies whether a given position as indicated by the position engine 130 has a high density of features or a low density of features based on whether a local entropy of the given position is at least or less than a predetermined threshold. It is noted that the following approach used by the entropy engine 135 is for a one-dimensional signal having four possible values. However, the use of the one-dimensional signal and four values is for illustrative purposes only. The exemplary embodiments may be modified to extend to bi-dimensional signals (e.g., images) and may include any number of values.

Figure 2:
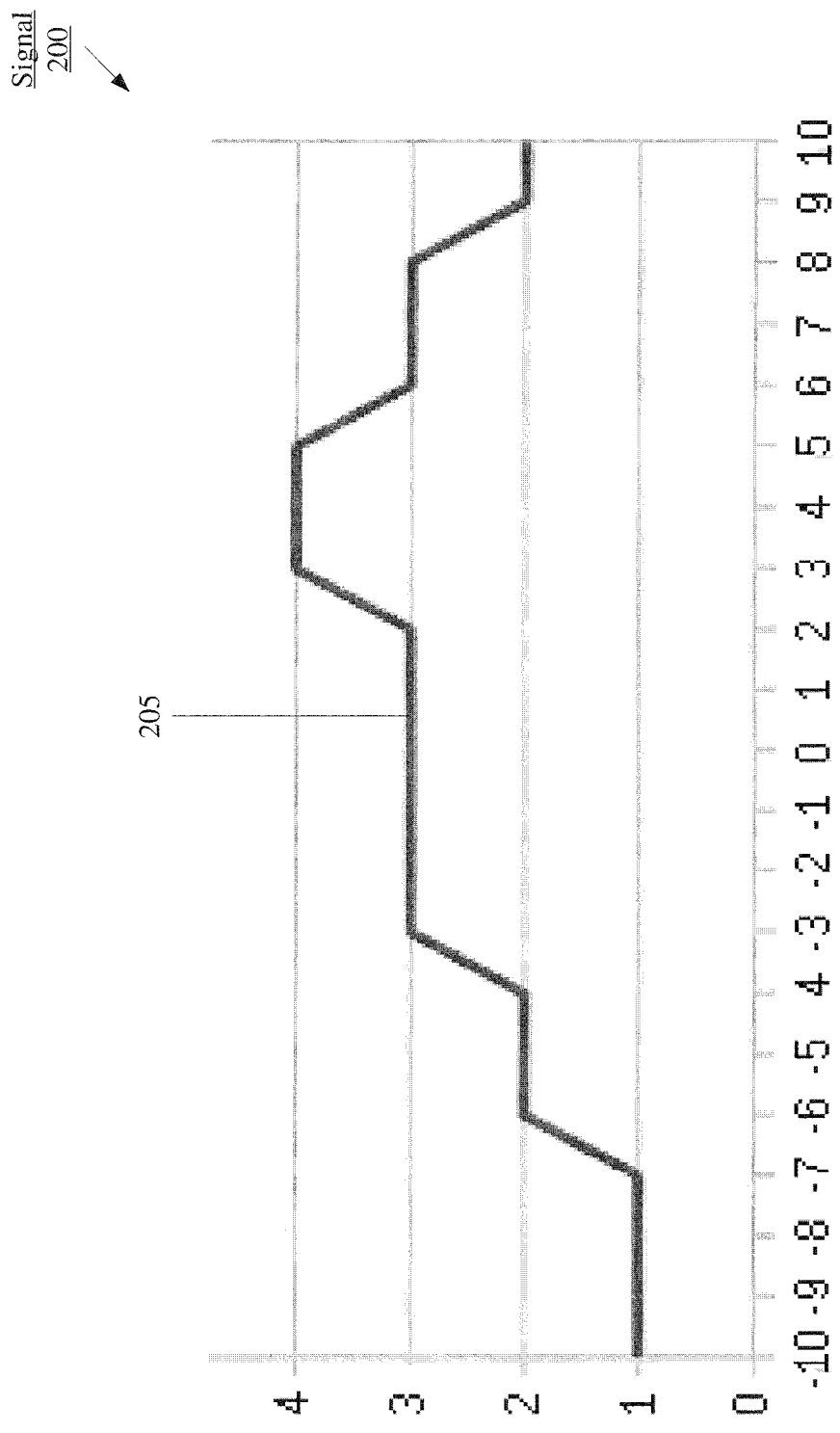
FIG. 2 shows an example signal analyzed by the sensor of FIG. 1 according to various exemplary embodiments described herein.

FIG. 2 shows an exemplary signal 200 analyzed by the sensor 100 of FIG. 1 according to various exemplary embodiments described herein. The signal 200 includes a curve 205 that indicates the different values of the signal 200 for each point in a given position. Thus, as illustrated, the curve 205 may include a value 1 from −10 to −7, a second value from −6 to −4, a third value from −3 to +2, a fourth value from +3 to +5, back to third value from +6 to +8, and back to the second value from +9 to +10. The entropy engine 135 may take this signal 200 and determine a distribution probability through displacements.

Figure 3:
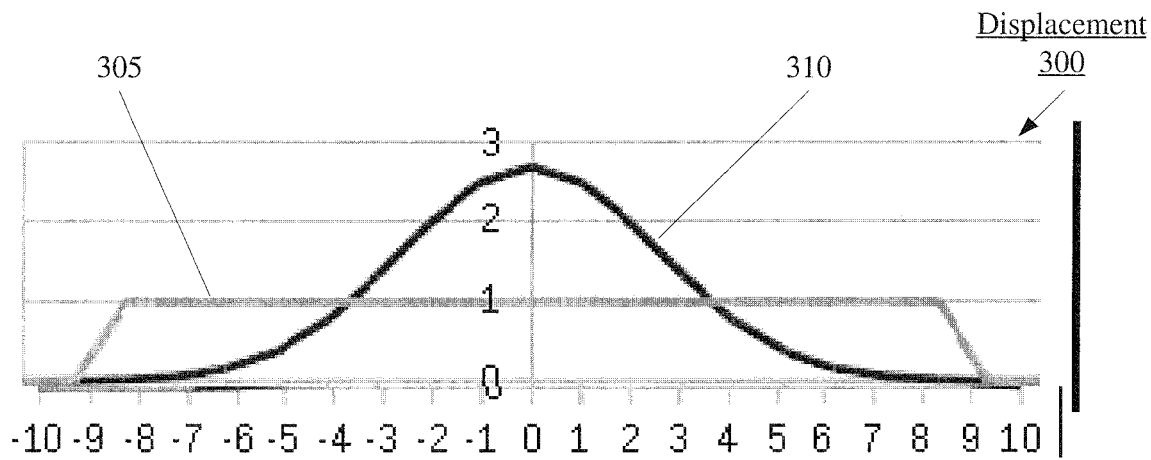
FIGS. 3-5 show example displacements of the signal of FIG. 2 according to various exemplary embodiments described herein.
Figure 4:
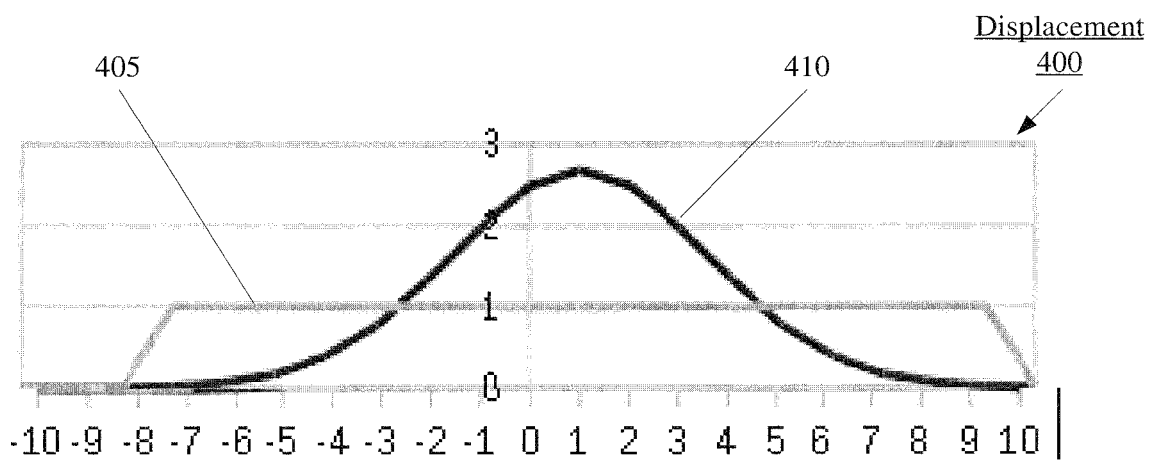
Figure 5:
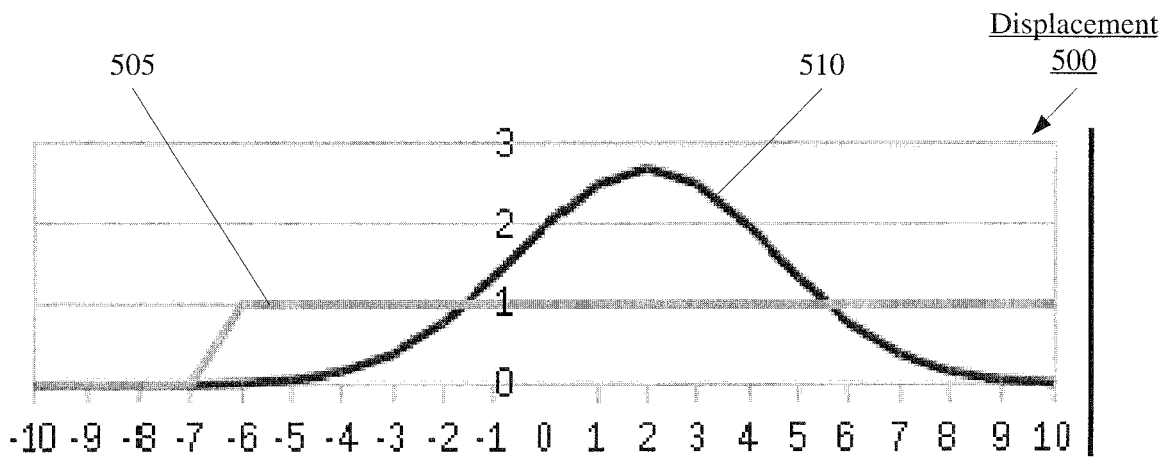

FIGS. 3-5 show displacements 300-500 of the signal 200 of FIG. 2 according to various exemplary embodiments described herein. Specifically, in FIG. 3, the displacement 300 may include a flat window 305 and a Gaussian window, both with a center position at 0 for the values 1 to 4 in the signal 200. In FIG. 4, the displacement 400 may include a flat window 405 and a Gaussian window 410, both with a center position at 1 for the values 1 to 4 in the signal 200. In FIG. 5, the displacement 500 may include a flat window 505 and a Gaussian window 510, both with a center position at 2 for the values 1 to 4 in the signal 200. Thus, the displacements 300-500 illustrate an analysis as the center shifts from 0 to 2.

FIGS. 6 and 7 show probability distribution sets 600-700 of the displacements 300-500 of FIGS. 3-5 according to various exemplary embodiments described herein. Specifically, the probability distribution set 600 includes the probabilities of the distribution 605 for the displacement 300 for the value 1 605*a*, the value 2 605*b*, the value 3 605*c*, and the value 4 605*d* of the signal 200. The probability distribution set 600 includes the probabilities of the distribution 610 for the displacement 400 for the value 1 610*a*, the value 2 610*b*, the value 3 610*c*, and the value 4 610*d* of the signal 200. The probability distribution set 600 includes the probabilities of distribution 615 for the displacement 500 for the value 1 615*a*, the value 2 615*b*, the value 3 615*c*, and the value 4 615*d* of the signal 200. The probability distribution set 600 relates to when the displacements 300-500 are shifted from 0 to 2 for the flat windows 305, 405, and 505.

The probability distribution set 700 includes the probabilities of the distribution 705 for the displacement 300 for the value 1 705*a*, the value 2 705*b*, the value 3 705*c*, and the value 4 705*d* of the signal 200. The probability distribution set 700 includes the probabilities of the distribution 710 for the displacement 400 for the value 1 710*a*, the value 2 710*b*, the value 3 710*c*, and the value 4 710*d* of the signal 200. The probability distribution set 700 includes the probabilities of the distribution 715 for the displacement 500 for the value 1 715*a*, the value 2 715*b*, the value 3 715*c*, and the value 4 715*d* of the signal 200. The probability distribution set 700 relates to when the displacements 300-500 are shifted from 0 to 2 for the Gaussian windows 310, 410, and 510.

As shown in the probability distribution set 700, as the value 4 migrates to the center of the window, the probability for the value 4 is increasing while the probability for the value 3 is decreasing in the case of the Gaussian window. Furthermore, while the value 1 is migrating outside the window, the probability is decreasing more smoothly in the case of the Gaussian window. In addition, for each individual probability determined using the above described calculations, a fuzzy probability for an individual symbol $x_i$ may be defined as $$p_{fuzzy}(x_i) = \sum_{x_j \in X} \frac{p(x_j)\omega(x_i, x_j)}{}$$

where $\omega$ is any continuous function (or similarity) that satisfies the following: $-\omega(x_i,x_j)=\omega(x_j,x_i)$ for symmetry, $-\omega(x_i,x_j)<\omega(x_j,x_i)$ for every $j<k<i$ when decreasing on a first side (e.g., left), and $-\omega(x_i,x_j)>\omega(x_j,x_i)$ for every $j<k<i$ when increasing on a second side (e.g., right). It is noted that depending on the $\omega$ function, $\Sigma p_{fuzzy}(x_i)$ obtained with the above may be greater than 1. Accordingly, the entropy engine 135 may be configured with a normalization phase in the calculations to eliminate this possibility.

Figure 8:
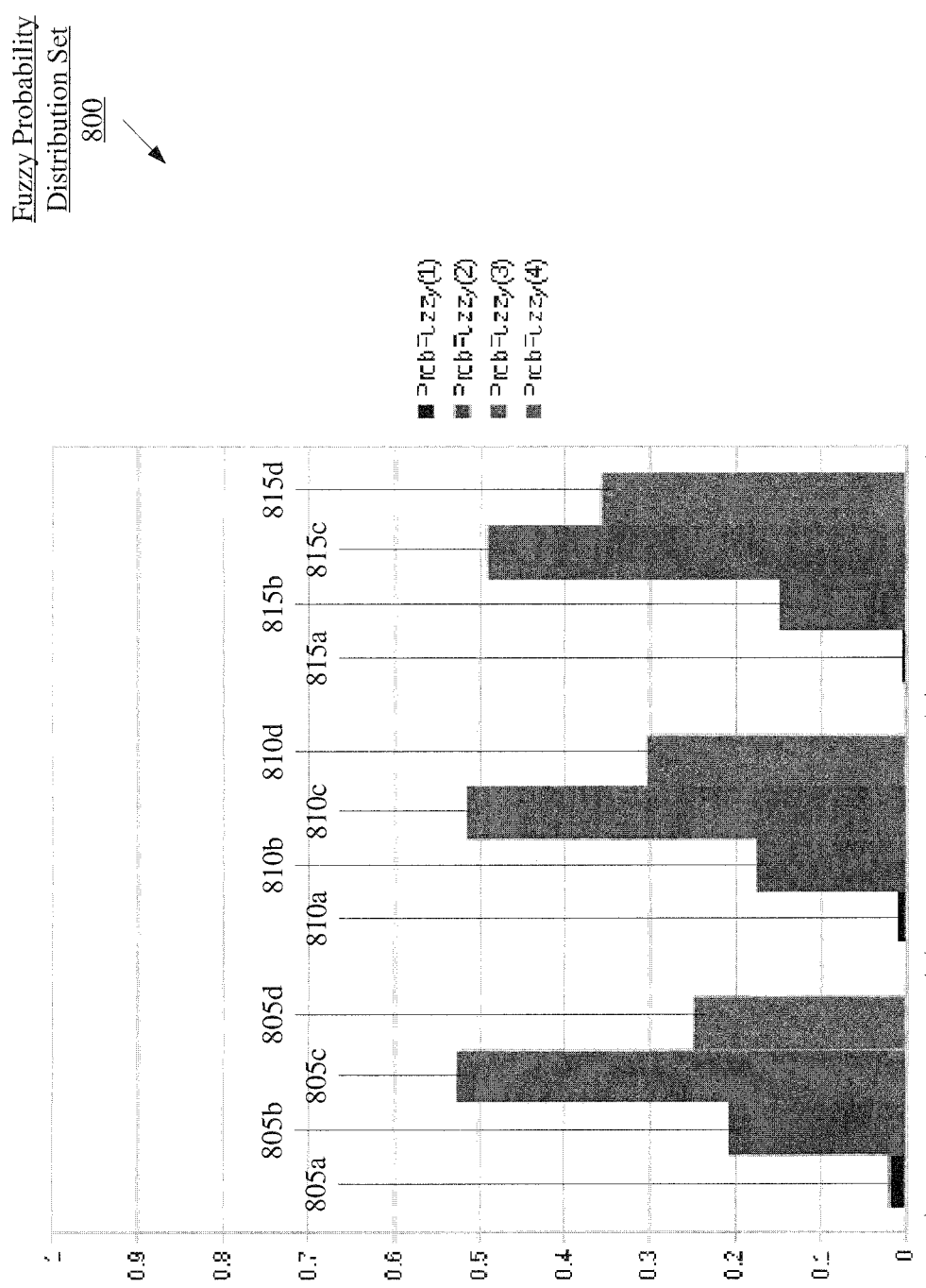
FIG. 8 shows an example fuzzy probability distribution set of the displacements of FIGS. 3-5 according to various exemplary embodiments described herein.

FIG. 8 shows a fuzzy probability distribution set 800 of the displacements 300-500 of FIGS. 3-5 according to various exemplary embodiments described herein. Specifically, the fuzzy probability distribution set 800 includes the fuzzy probabilities of the distribution 805 for the displacement 300 for the value 1 805*a*, the value 2 805*b*, the value 3 805*c*, and the value 4 805*d* of the signal 200. The fuzzy probability distribution set 800 includes the fuzzy probabilities of the distribution 810 for the displacement 400 for the value 1 810*a*, the value 2 810*b*, the value 3 810*c*, and the value 4 810*d* of the signal 200. The fuzzy probability distribution set 800 includes the fuzzy probabilities of distribution 815 for the displacement 500 for the value 1 815*a*, the value 2 815*b*, the value 3 815*c*, and the value 4 815*d* of the signal 200. The fuzzy probability distribution set 800 relates to when the displacements 300-500 are shifted from 0 to 2 for the Gaussian windows 310, 410, and 510. As is clear to one skilled in the art, relative to the probabilities of the distributions 705, 710, 715 of the probability distribution set 700, the fuzzy probability distribution set 800 include probability differences that are more attenuated while the window is shifting (e.g., to the right when the center is shifting from 0 to 2).

The above describes an exemplary process used by the entropy engine 135 to identify whether a given position has a high density of features or a low density of features. As described above, when the image includes at least one position that has a low density of features, the rate engine 140 may select the averaging or denoising operation to be performed on the given position. As any signal may be susceptible to noise (e.g., including the signal generated by the capturing component 120), the averaging operation provides a pre-processing on the image data corresponding to the position having a low density of features. In contrast, a standard operation on image data corresponding to a position having a high density of features may retain all aspects of the image data (e.g., including any potential noise that was captured). By using the averaging operation, the image data for the corresponding position may be transmitted to the receiver using lower transmission requirements such as bandwidth as this image data has a lower amount of data and may also be less complex. In this manner, compression algorithms applied to the image may also improve other data related operations such as storage.

Figure 9:
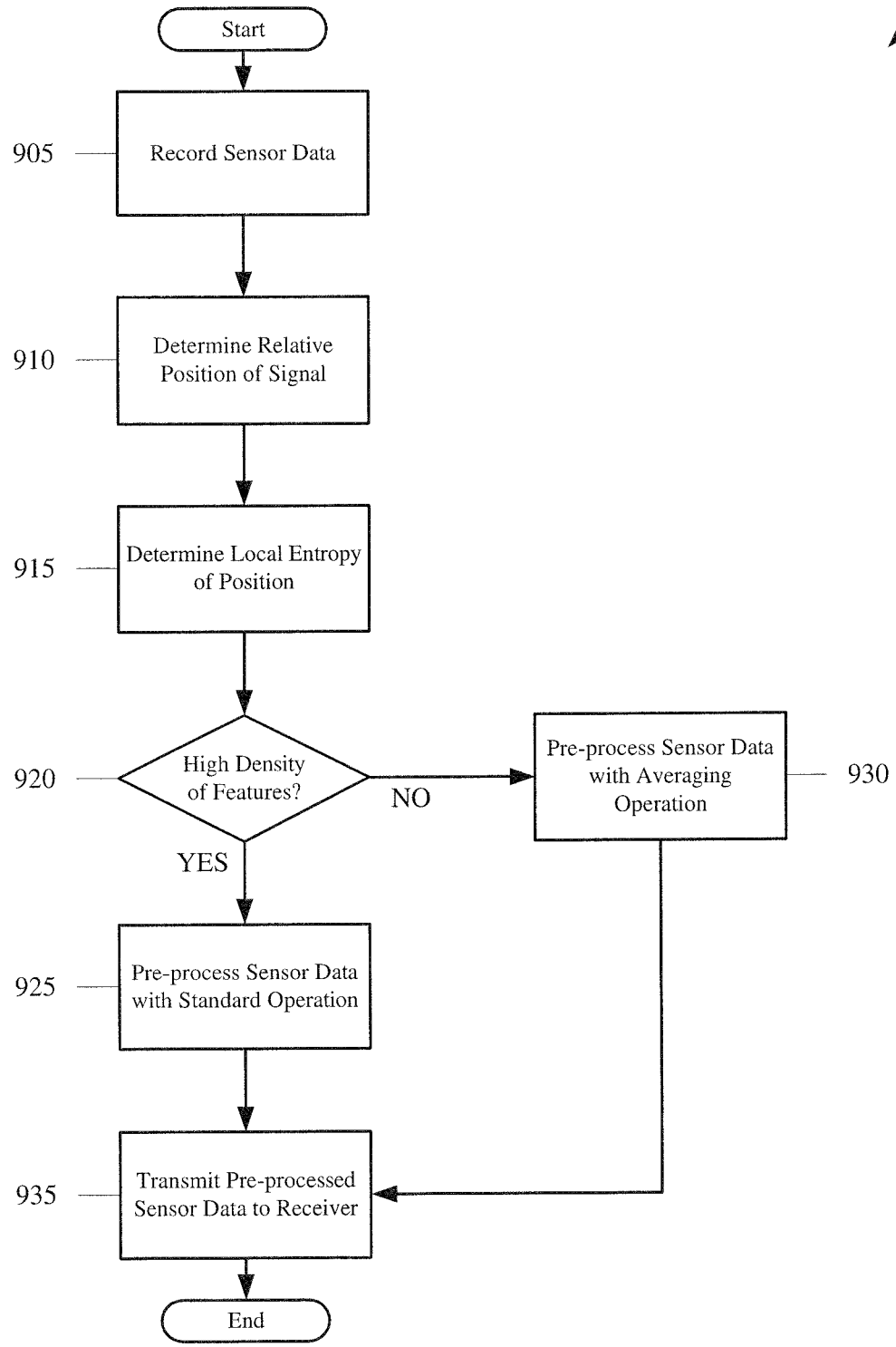
FIG. 9 shows an example method to pre-process captured data according to various exemplary embodiments described herein.

FIG. 9 shows a method 900 to pre-process captured data according to various exemplary embodiments described herein. Specifically, the sensor 100 may perform a pre-processing operation to determine regions having either a high density of features or a low density of features based on an entropy analysis. The method 200 may be performed by the sensor 100 prior to generating and transmitting image data to a receiver that performs further image processing operations. The method 200 will be described with regard to the sensor 100 of FIG. 1.

In 905, the sensor 100 records sensor data. As noted above, the sensor data may be image data for still images or video frames. Using the capturing component 120 to capture raw sensor data, the recording engine 125 may initially process the raw sensor data for formatting and other operations to prepare the data for further processing by the engines 130-140. Furthermore, the sensor data may be captured and provided to the recording engine 125 as a signal indicating the values (e.g., one-dimensional, bi-dimensional, etc.) included therein.

In 910, the sensor 100 determines a relative position of the signal. Specifically, using the position engine 130, the position may relate to a window or locus of data points or pixels as a portion of the image that the sensor data corresponds. As the image processing mechanism according to the exemplary embodiments is used for one or more portions (e.g., all portions comprising the image) in which the averaging or standard operation is applied, the relative position may enable the image to be assembled at a subsequent time.

In 915, the sensor 100 determines a local entropy of the position. As described in detail above, the entropy engine 135 may determine the local entropy through a modified approach based on a Shannon Entropy analysis. By determining a probability distribution as the signal is displaced in the position, a fuzzy probability distribution may also be determined. By defining an occurrence function and a window function for the position, the local entropy may be determined as a product of the occurrence function and the window function.

In 920, the sensor 100 determines whether the position has a high density of features. The density of features may be determined to be high by the entropy engine 135 when the local entropy of the position is at least a predetermined threshold while the local entropy of the position being less than the predetermined threshold may indicate a low density of features. When the density of features is high, the sensor 100 continues to 925 where the sensor data is pre-processed with a standard operation to retain the features as was captured by the capturing component 120. When the density of features is low, the sensor 100 continues to 930 where the sensor data is pre-processed with an averaging operation to average the features and denoise the position of the signal.

In 935, the sensor 100 transmits the pre-processed sensor data to the transmitter. As noted above, the sensor 100 may perform this aspect of the image processing mechanism according to the exemplary embodiments for one or more positions of the signal. If this position is the only one to be pre-processed, the sensor 100 may transmit the pre-processed sensor data to the transmitter. If further positions are to be pre-processed, the sensor 100 may return to 910 until the further positions (e.g., up to all remaining positions) have been pre-processed. The sensor 100 may also transmit the pre-processed sensor data in its entirety after all selected positions have been pre-processed or piecemeal after each position has been pre-processed.

Figure 10:
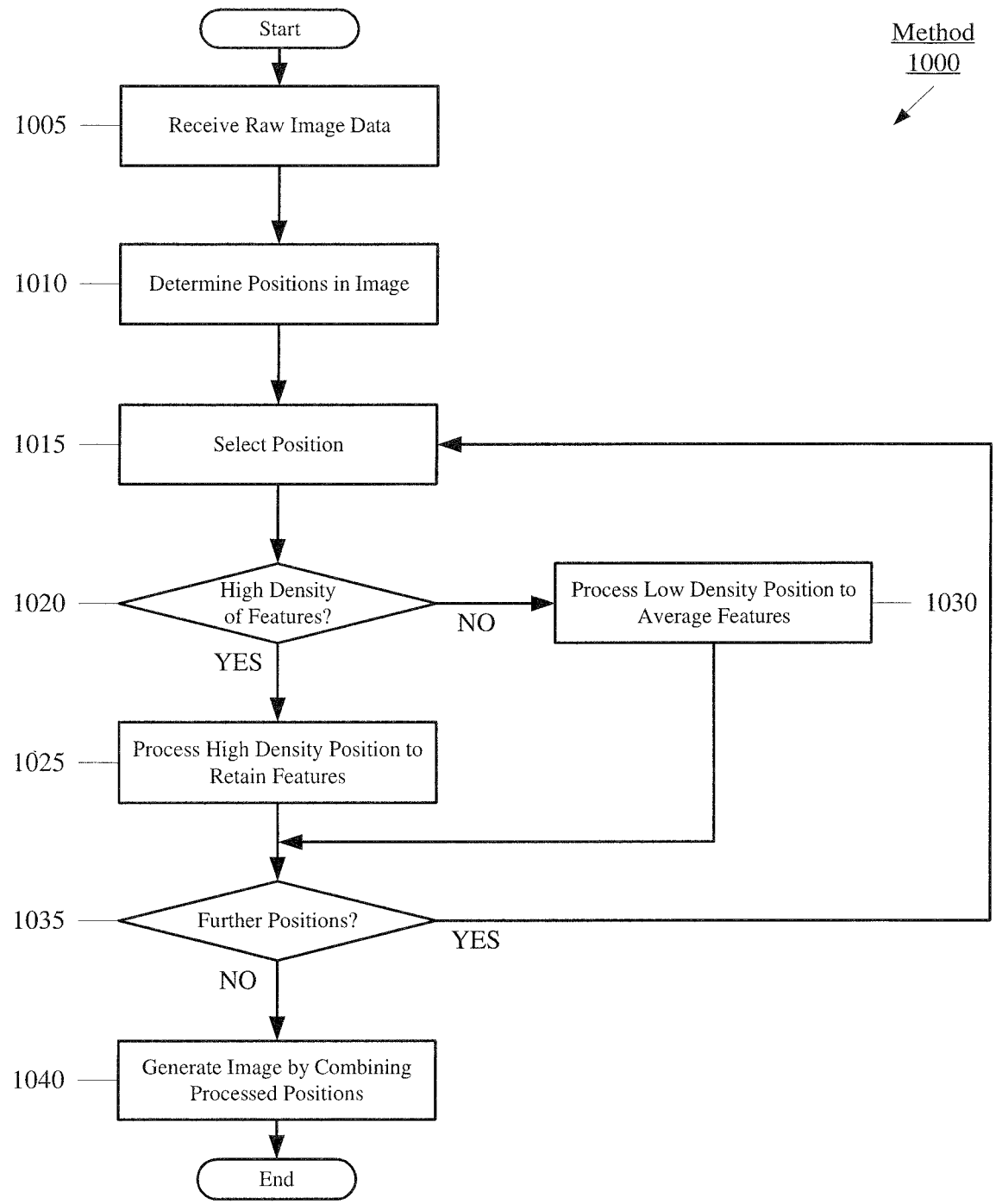
FIG. 10 shows an example method to generate an image file according to various exemplary embodiments described herein.

FIG. 10 shows a method 1000 to generate an image file according to various exemplary embodiments described herein. Specifically, an image capturing device including the sensor 100 may perform image processing operations including compression operations to generate an image file. The method 300 may be performed by the sensor 100 in addition to a receiver as an imaging unit. The method 300 will be described with regard to the sensor 100 of FIG. 1.

In 1005, the imaging unit receives raw image data using the capturing component 120 in a substantially similar manner as recording the raw image data in the method 900. In 1010, the imaging unit determines positions in the image such as windows or locus of points (e.g., pixels) in a substantially similar manner as the position determination in the method 900.

In 1015, the imaging unit selects a position to pre-process. Thus, in 1020, the imaging unit determines whether the selected position has a high density of features or a low density of features. The imaging unit via the entropy engine 135 may perform this determination in a manner substantially similar to the one used in the method 900. If the selected position has a high density of features, the imaging unit continues to 1025 where the high density position is processed to retain the features as captured by the capturing component 120. If the selected position has a low density of features, the imaging unit continues to 1030 where the low density position is processed with an averaging operation to average the features and denoise the position.

In 1035, the imaging unit determines if there are any further positions to process with the imaging processing mechanism according to the exemplary embodiments. If there is at least one further position, the imaging unit returns to 1015. However, if all selected positions or all positions have been processed in this manner, the imaging unit continues to 1040 where the image is generated by combining the processed positions. When at least one of the positions is processed with the averaging operation based on the entropy analysis that indicates a low density of features, the image that is generated may require less storage requirements and the image may also be more compressible using any compression operation.

The exemplary embodiments provide a device, system, and method of pre-processing positions of an image to identify whether a density of features therein is high or low using an entropy based approach where a high local entropy in the position indicates a high density of features and a low local entropy in the position indicates a low density of features. Based on this identification, the exemplary embodiments may be configured to perform a corresponding pre-processing operation on the position where positions with a high density of features have a standard operation applied to retain the features as was captured and positions with a low density of features have an averaging operation applied to average the features and denoise the data. In this manner, the exemplary embodiments may provide a throughput control mechanism, particularly in the Internet of Things (IoT) environment. Specifically, for a sensor producing data at a given rate, by continuously evaluating the local entropy of the most recent sensor data corresponding to a given position, the sensor may adapt the transmission rate to a receiver by decreasing when the local entropy is below a predetermined threshold. Accordingly, the bandwidth between the sensor and the receiver may be reduced. Furthermore, the exemplary embodiments may improve multimedia storage and transmission without a significant quality decrease, particularly to a human subject viewing the image.

Those skilled in the art will understand that the above-described exemplary embodiments may be implemented in any suitable software or hardware configuration or combination thereof. An exemplary hardware platform for implementing the exemplary embodiments may include, for example, an Intel x86 based platform with compatible operating system, a Windows platform, a Mac platform and MAC OS, a mobile device having an operating system such as iOS, Android, etc. In a further example, the exemplary embodiments of the above described method may be embodied as a program containing lines of code stored on a non-transitory computer readable storage medium that may be executed on a processor or microprocessor.

It will be apparent to those skilled in the art that various modifications may be made in the present disclosure, without departing from the spirit or the scope of the disclosure. Thus, it is intended that the present disclosure cover modifications and variations of this disclosure provided they come within the scope of the appended claims and their equivalent.

What is claimed is:

1. A method, comprising:
   at a sensor communicatively connected to a receiver:
      capturing sensor data;
      selecting a position in the sensor data;
      determining a local entropy of the position based on an entropy operation that indicates a probability distribution of a plurality of available values;
      when the local entropy is below a predetermined threshold, applying a first pre-processing operation to the position that averages features included in the position;

wherein the local entropy being below the predetermined threshold indicates a low density of the features in the position; and transmitting the pre-processed sensor data corresponding to the position to the receiver.

2. The method of claim 1, wherein, when the local entropy is at least the predetermined threshold, the method further comprises:

applying a second pre-processing operation to the position that retains the features included in the position.

3. The method of claim 2, wherein the local entropy being at least the predetermined threshold indicates a high density of the features in the position.

4. The method of claim 1, wherein the predetermined threshold is based on a maximum theoretical entropy of the available values.

5. The method of claim 1, wherein the first pre-processing operation further denoises the sensor data corresponding to the position.

6. The method of claim 1, wherein the local entropy is determined based on a presence function that satisfies a first criteria of being continuous relative to position and a second criteria of the presence of one of the features increasing a presence probability of another one of the features that is substantially similar.

7. The method of claim 6, wherein the first criteria is satisfied by determining a frequency for each of the available values in a relative location in the position.

8. The method of claim 1, wherein the local entropy is determined based on a Shannon Entropy analysis.

9. The method of claim 8, wherein the local entropy is determined based on a product of an occurrence function each of the available values and a window function corresponding to the selected position.

10. The method of claim 9, wherein the local entropy is determined based on a displacement of a distribution of the available values within the position.

11. The method of claim 1, wherein the sensor data is image data.

12. A sensor, comprising:

a capturing component configured to capture sensor data;

a processor selecting a position in the sensor data, the processor determining a local entropy of the position based on an entropy operation that indicates a probability distribution of a plurality of available values, when the local entropy is below a predetermined threshold, the processor applying a first pre-processing operation to the position that averages features included in the position, wherein the local entropy being below the predetermined threshold indicates a low density of the features in the position; and a transceiver configured to transmit the pre-processed sensor data corresponding to the position to a receiver that is communicatively connected to the sensor.

13. The sensor of claim 12, wherein, when the local entropy is at least the predetermined threshold, the processor applies a second pre-processing operation to the position that retains the features included in the position.

14. The sensor of claim 13, wherein the local entropy being at least the predetermined threshold indicates a high density of the features in the position.

15. The sensor of claim 12, wherein the predetermined threshold is based on a maximum theoretical entropy of the available values.

16. The sensor of claim 12, wherein the first pre-processing operation further denoises the sensor data corresponding to the position.

17. The sensor of claim 12, wherein the sensor data is image data.

18. An imaging arrangement, comprising:

a receiver; and a sensor capturing image data, the sensor selecting a position in the image data, the sensor determining a local entropy of the position based on an entropy operation that indicates a probability distribution of a plurality of available values, when the local entropy is below a predetermined threshold, the sensor applying a first pre-processing operation to the position that averages features included in the position, wherein the local entropy being below the predetermined threshold indicates a low density of the features in the position, when the local entropy is at least the predetermined threshold, the sensor applying a second pre-processing operation to the position that retains the features included in the position, the sensor transmitting the pre-processed sensor data corresponding to the position to the receiver, wherein the receiver performs a compression operation on the pre-processed sensor data corresponding to the position.

* * * * *